(12) United States Patent
Wang et al.

(10) Patent No.: US 11,855,003 B2
(45) Date of Patent: Dec. 26, 2023

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Pu Wang, Hsinchu (TW); Li-Hui Cheng, New Taipei (TW); Szu-Wei Lu, Hsinchu (TW); Hsien-Ju Tsou, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 223 days.

(21) Appl. No.: 17/320,179

(22) Filed: May 13, 2021

(65) Prior Publication Data
US 2022/0367383 A1 Nov. 17, 2022

(51) Int. Cl.
*H01L 21/48* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/0655* (2013.01);
(Continued)

(58) Field of Classification Search
CPC ..... H01L 24/19; H01L 24/20; H01L 25/0655; H01L 25/18; H01L 25/50; H01L 2221/68372; H01L 2224/214; H01L 2924/1431; H01L 2924/1434; H01L 2924/19103; H01L 2924/3511; H01L 23/585; H01L 25/16; H01L 23/49816; H01L 23/5385; H01L 23/562; H01L 21/4853; H01L 21/4857; H01L 21/565; H01L 21/568; H01L 21/6835; H01L 23/3128; H01L 23/5383; H01L 23/5386; H01L 23/5389
USPC ....................................................... 257/668
See application file for complete search history.

(56) References Cited

U.S. PATENT DOCUMENTS 7,247,950 B2 * 7/2007 Fujisawa ............... H01L 24/82
257/E25.011
8,779,599 B2 * 7/2014 Lin ....................... H01L 21/561
257/725

(Continued)

*Primary Examiner* — Vu A Vu
(74) *Attorney, Agent, or Firm* — JCIPRNET

(57) ABSTRACT

A method of fabricating an integrated fan-out package is provided. A ring-shaped dummy die and a group of integrated circuit dies are mounted over a carrier, wherein the group of integrated circuit dies are surrounded by the ring-shaped dummy die. The ring-shaped dummy die and the group of integrated circuit dies over the carrier are encapsulated with an insulating encapsulation. A redistribution circuit structure is formed on the ring-shaped dummy die, the group of integrated circuit dies and the insulating encapsulation, wherein the redistribution circuit structure is electrically connected to the group of integrated circuit dies, and the ring-shaped dummy die is electrically floating.

20 Claims, 15 Drawing Sheets

(51) Int. Cl.
*H01L 23/538* (2006.01)
*H01L 25/065* (2023.01)
*H01L 25/18* (2023.01)
*H01L 21/683* (2006.01)
*H01L 21/56* (2006.01)
*H01L 25/00* (2006.01)
*H01L 23/31* (2006.01)

(52) U.S. Cl.
CPC .............. *H01L 25/18* (2013.01); *H01L 25/50* (2013.01); *H01L 2221/68372* (2013.01); *H01L 2224/214* (2013.01); *H01L 2924/1431* (2013.01); *H01L 2924/1434* (2013.01); *H01L 2924/19103* (2013.01); *H01L 2924/3511* (2013.01)

(56) References Cited

U.S. PATENT DOCUMENTS

| | | | |
|---|---|---|---|
| 8,987,915 B1 * | 3/2015 | Yu | H01L 24/94 |
| | | | 257/773 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,937,749 B2 * | 3/2021 | Shih | H01L 24/97 |
| 11,328,992 B2 * | 5/2022 | Lin | H01L 23/522 |

\* cited by examiner

PACKAGE STRUCTURE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. Warpage control of integrated fan-out packages for reliability improvement is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
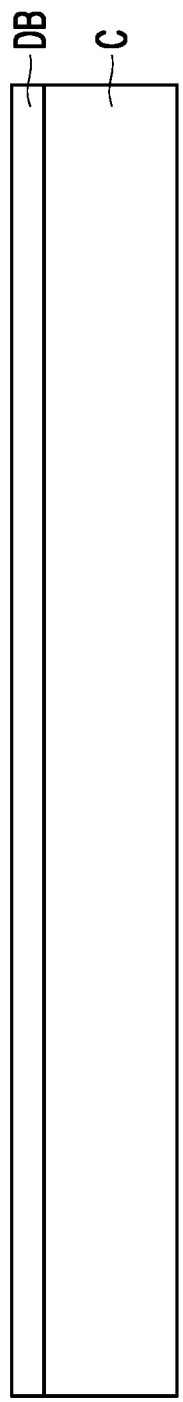
FIGS. 1 through 9 are cross-sectional views illustrating a process flow for fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 9 are cross-sectional views illustrating a process flow for fabricating an integrated fan-out package in accordance with some embodiments of the present disclosure. FIGS. 10A through 10C are top views schematically illustrating various arrangements of integrated circuit dies and a dummy die in accordance with the second embodiment of the present disclosure.

Referring to FIG. 1, a carrier C having a de-bonding layer DB formed thereon is provided. The de-bonding layer DB is formed to entirely cover an upper surface of the carrier C. The carrier C may be a wafer form substrate, the de-bonding layer DB may be a dielectric layer, and adhesion of the de-bonding layer DB can be reduced through a de-bonding process. The de-bonding process may be a thermal curing process, an optical curing process or other suitable curing treatment. The carrier C may be a glass substrate, the de-bonding layer DB may be a light-to-heat conversion (LTHC) release layer formed on the upper surface of the glass substrate, and the adhesion of the light-to-heat conversion release layer may be lowered through an optical curing process. The materials of the de-bonding layer DB and the carrier C are merely for illustration, and the disclosure is not limited thereto.

Figure 2:
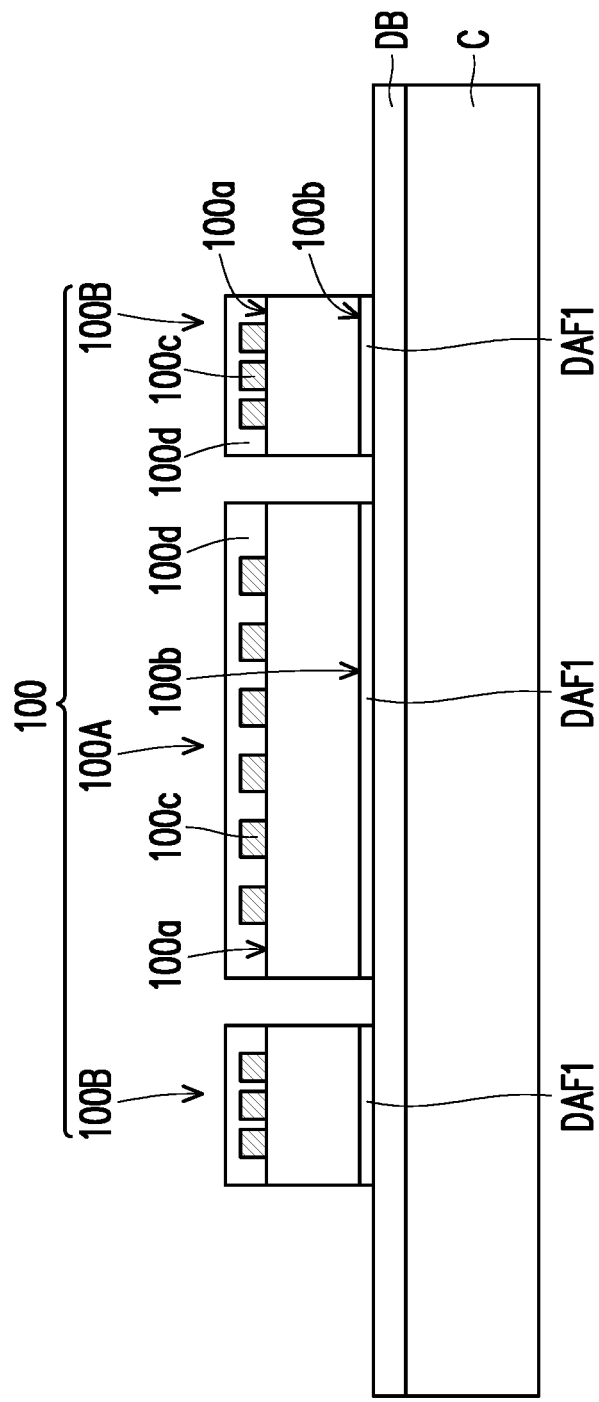

Referring to FIG. 2, at least one group of integrated circuit dies 100 are mounted on the de-bonding layer DB carried by the carrier C. The group of integrated circuit dies 100 may be mounted on the de-bonding layer DB through a pick-up and place process. In some embodiments, as illustrated in FIG. 2, the integrated circuit dies 100 mounted on the de-bonding layer DB may be substantially identical in thickness. In some alternative embodiments, not illustrated in figures, the integrated circuit dies 100 mounted on the de-bonding layer DB may be different in thickness. Each one of the integrated circuit dies 100 may include an active surface 100a, a rear surface 100b opposite to the active surface 100a, and a plurality of conductive pillar 100c (e.g., aluminum pads) distributed on the active surface 100a. In some embodiments, the integrated circuit die 100 may further include a protection layer 100d, wherein the protection layer 100d is disposed on the active surface 100a and covers the conductive pillar 100c. The conductive pillar 100c are electrically connected to circuitry formed in the integrated circuit dies 100. The rear surfaces 100b of the integrated circuit dies 100 are adhered with the de-bonding layer DB carried by the carrier C. The rear surfaces 100b of the integrated circuit dies 100 may be adhered with the de-bonding layer DB through die attachment films DAF1. The conductive pillars 100c disposed on the active surface 100a of the integrated circuit dies 100 may be formed by wafer level plating process. The protection layer 100d may be formed by wafer level deposition process. In some embodiments, the conductive pillars 100c are copper pillars. In some alternative embodiments, the conductive pillars 100c are copper pillars with solder caps (not shown) formed on the top surfaces thereof. The conductive pillars 100c may be made from other conductive materials, and the disclosure is not limited thereto. Furthermore, the material of the protection layer 100d may include silicon oxide, silicon nitride, polyimide, polybenzoxazole (PBO) or other suitable dielectric material.

The die attachment films DAF1 may be formed through a wafer level process. The integrated circuit dies 100 may be fabricated and singulated from semiconductor wafers. Before the singulation process of the semiconductor wafers, die attachment material may be formed on the rear surfaces of the semiconductor wafers, and a wafer saw process may be then performed to singulate the semiconductor wafers such that the integrated circuit dies 100 having the die attachment films DAF1 adhered on the rear surfaces thereof are obtained.

In FIG. 2, multiple integrated circuit dies 100 (e.g., three integrated circuit dies 100) are mounted on the de-bonding layer DB carried by the carrier C. It is noted that, the number of the integrated circuit dies 100 is merely for illustration, and the disclosure is not limited thereto. In some other embodiments, before the integrated circuit dies 100 are mounted onto the de-bonding layer DB, an insulating layer (not shown) is formed on the de-bonding layer DB in advance. The insulating layer is a polybenzoxazole (PBO) layer or other suitable polymer insulating layers, for example. In some alternative embodiments, before the integrated circuit dies 100 are mounted onto the de-bonding layer DB, a redistribution circuit structure including stacked dielectric layers and redistribution wirings embedded in the stacked dielectric layers is formed on the de-bonding layer DB in advance.

The group of integrated circuit dies 100 may include different types of integrated circuit dies 100A and 100B. As illustrated in FIG. 2, the group of integrated circuit dies 100 includes at least one System-on-Chip (SoC) die 100A (e.g., the semiconductor die 100A located at the central portion of FIG. 2) and at least two memory dies 100B (e.g., the semiconductor dies 100B located at the right and left portions of FIG. 2). The SoC die 100A among the group of integrated circuit dies 100 may include an application specific integrated circuit (ASIC) die, a radio frequency integrated circuit (RF-IC) die or combinations thereof. The memory dies 100B among the integrated circuit dies 100 may include memory chips, such as high bandwidth memory (HBM) chips, SRAM chips, DRAM chips, RRAM chips or combinations thereof. The functionality of the integrated circuit dies 100A and 100B is not limited in this disclosure.

Figure 3:
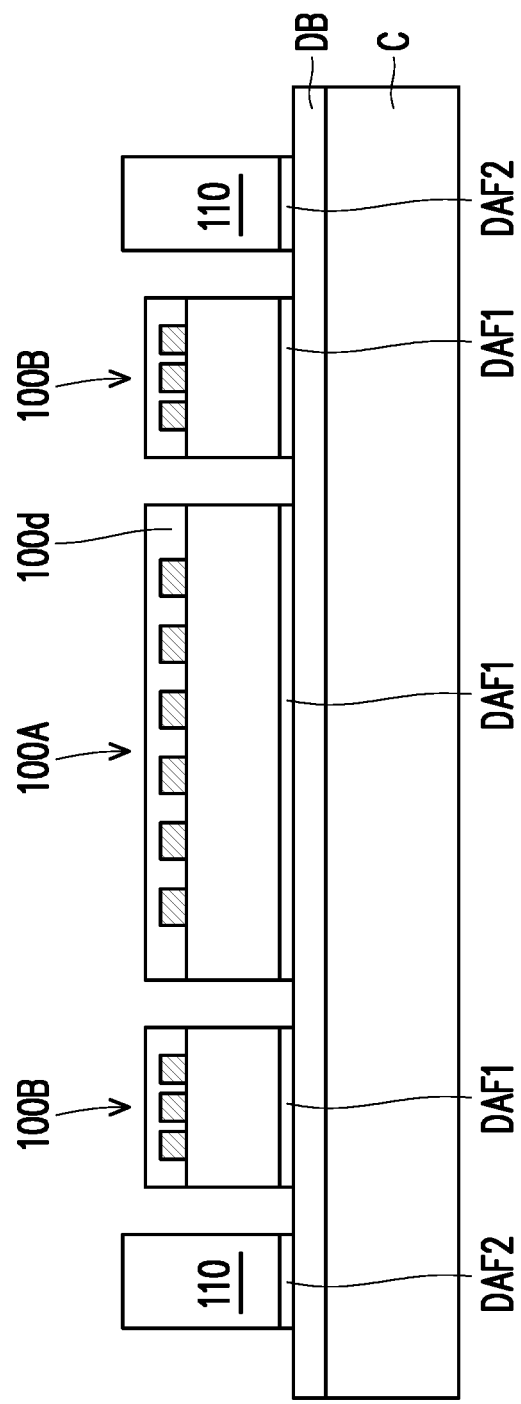

Referring to FIG. 3, after the group of integrated circuit dies 100A and 100B are mounted onto the de-bonding layer DB through the die attachment films DAF1, a ring-shaped dummy die 110 including an aperture 112 is provided and mounted on the de-bonding layer DB through a die attachment film DAF2. The ring-shaped dummy die 110 is a single piece element for warpage control. A pick-up and place process may be performed to mount the ring-shaped dummy die 110 onto the de-bonding layer DB carried by the carrier C. The material of the die attachment films DAF1 may be the same as or different from that of the die attachment film DAF2. The die attachment film DAF2 may be formed through a wafer level process. The ring-shaped dummy die 110 may be fabricated and cut from semiconductor substrates (e.g., semiconductor wafers). Before the cut process of the semiconductor substrates, die attachment material may be formed on surfaces of the semiconductor substrates, and a saw process may be then performed to cut the semiconductor substrates such that the ring-shaped dummy die 110 having the die attachment film DAF2 adhered thereon is obtained.

As illustrated in FIG. 3 and FIGS. 10A through 10C, the ring-shaped dummy die 110 may be a semiconductor frame including the aperture 112. The ring-shaped dummy die 110 (i.e. the semiconductor frame) may be a silicon frame. The ring-shaped dummy die 110 surrounds the group of integrated circuit dies 100A and 100B, and the ring-shaped dummy die 110 is separated from the group of integrated circuit dies 100A and 100B. The shape of the aperture 112 of the ring-shaped dummy die 110 may be designed in accordance with profiles of the group of integrated circuit dies 100A and 100B.

In some embodiments, as illustrated in FIG. 10A, the group of integrated circuit dies 100 include one integrated circuit dies 100A and two integrated circuit dies 100B disposed at opposite sides of the integrated circuit dies 100A, and the ring-shaped dummy die 110 is a cross-shaped dummy die having a cross-shaped aperture 112. In some other embodiments, as illustrated in FIG. 10B, the group of integrated circuit dies 100 include one integrated circuit dies 100A and two rows of integrated circuit dies 100B (e.g., six integrated circuit dies 100B arranged in two rows) disposed at opposite sides of the integrated circuit dies 100A, and the ring-shaped dummy die 110 is a rectangular-shaped dummy die having a rectangular-shaped aperture 112. In some alternative embodiments, as illustrated in FIG. 10C, the group of integrated circuit dies 100 include one integrated circuit dies 100A and two integrated circuit dies 100B disposed at opposite sides of the integrated circuit dies 100A, and the ring-shaped dummy die 110 is a rectangular-shaped dummy die having a cross-shaped aperture 112.

In some embodiments, as illustrated in FIG. 3, the thickness of the integrated circuit dies 100A is substantially equal to that of the integrated circuit dies 100B, and the thickness of the ring-shaped dummy die 110 is greater than that of the group of integrated circuit dies 100A and 100B. In some alternative embodiments, the thickness of the integrated circuit dies 100A is substantially equal to that of the integrated circuit dies 100B, and the thickness of the ring-shaped dummy die 110 is smaller than that of the group of integrated circuit dies 100A and 100B. The thickness difference between the ring-shaped dummy die 110 and the group of integrated circuit dies 100A and 100B may be smaller than 150 micrometers. Since the thickness of the ring-shaped dummy die 110 is greater than the thickness of the group of integrated circuit dies 100A and 100B, the group of integrated circuit dies 100A and 100B are not in contact with the pick-up head utilized in the pick-up and place process of the ring-shaped dummy die 110. Accordingly, the group of integrated circuit dies 100A and 100B are not damaged by the pick-up head when mounting the ring-shaped dummy die 110 onto the de-bonding layer DB.

In some alternative embodiments, not illustrated in figures, the thickness of the integrated circuit dies 100A is different from that of the integrated circuit dies 100B, and the thickness of the ring-shaped dummy die 110 is greater than the thicknesses of the group of integrated circuit dies 100A and 100B.

Figure 4:
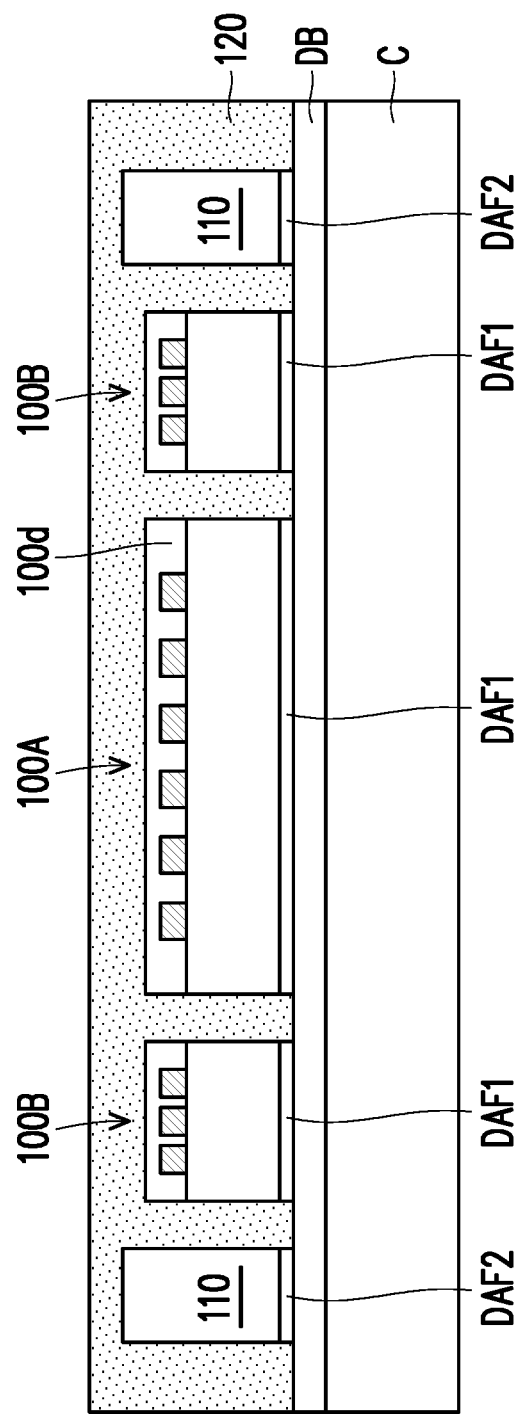

Referring to FIG. 4, after the integrated circuit dies 100A and 100B are mounted on the de-bonding layer DB, an insulating material 120 is formed over the de-bonding layer DB to entirely cover the group of integrated circuit dies 100A and 100B. In some embodiments, the insulating material 120 is formed through an over-mold process. The maximum thickness of the insulating material 120 is greater than the thickness of the ring-shaped dummy die 110 and the thickness of the group of integrated circuit dies 100A and 100B. The minimum thickness of the insulating material 120 may range from about 50 um to about 500 um. In some embodiments, the insulating material 120 includes resin and the filler added in the resin, wherein the resin is epoxy resin, the filler added in the resin may be silica or aluminum oxide ($Al_2O_3$), and the insulating material 120 may be formed by over-molding process. In some other embodiments, the insulating material 120 includes TEOS-formed oxide deposited by chemical vapor deposition (CVD) process.

Figure 5:
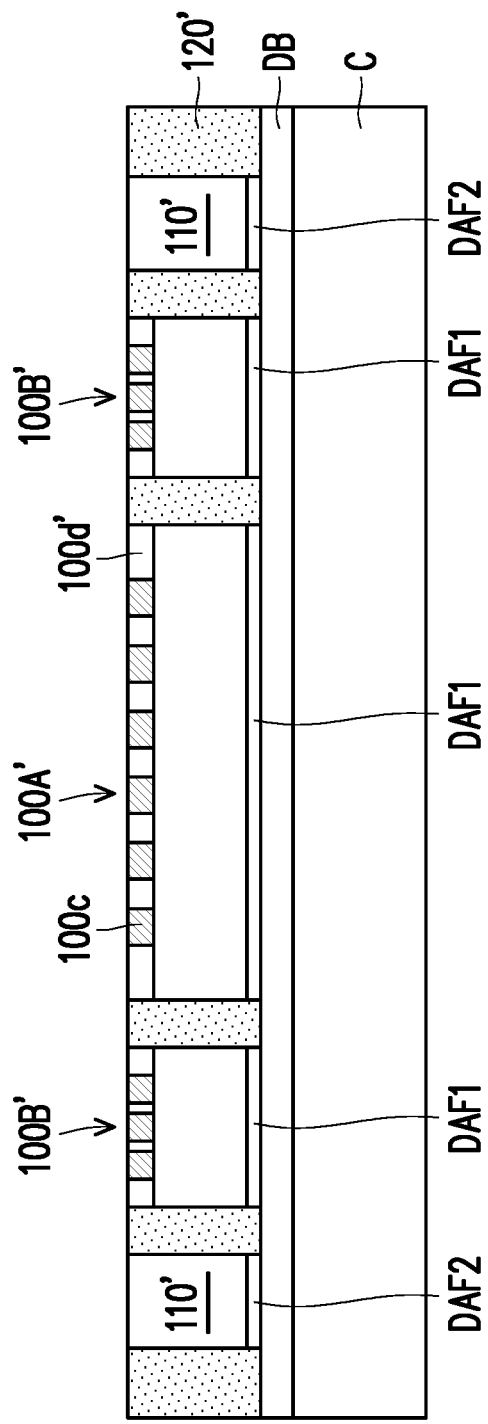

Referring to FIG. 4 and FIG. 5, a removal process may be performed to partially remove the insulating material 120 until the conductive pillars 100c are revealed. The removal process may be performed to remove a portion of the insulating material 120 and a portion of the protection layer 100d' such that top surfaces of the conductive pillars 100c are revealed. After performing the removal process, an integrated circuit die 100A', integrated circuit dies 100B and a ring-shaped dummy die 110' and an insulating encapsulation 120' with reduced thickness are formed. The integrated circuit die 100A', the integrated circuit dies 100B' and the ring-shaped dummy die 110' are laterally encapsulated by the insulating encapsulation 120'. Each of the integrated circuit die 100A' and the integrated circuit dies 100B' includes a protection layer 100d' having reduced thickness, and the conductive pillars 100c are laterally encapsulated by the protection layer 100d'. The above-mentioned removal process may be an etch process, a chemical mechanical polishing (CMP) process, a mechanical grinding process or combinations thereof. After forming the insulating encapsulation 120', sidewalls of the integrated circuit die 100A, the integrated circuit dies 100B and the ring-shaped dummy die 110 are in contact with sidewalls of the insulating encapsulation 120' directly. In some embodiments, as illustrated in FIG. 5, the thickness of the insulating encapsulation 120' is substantially equal to the thickness of the integrated circuit die 100A', the integrated circuit dies 100B' and the ring-shaped dummy die 110'.

In some alternative embodiments, not illustrated in figures, the thickness of the insulating encapsulation 120' is slightly less than or greater than the thickness of the integrated circuit die 100A', the integrated circuit dies 100B' and the ring-shaped dummy die 110'.

Figure 6:
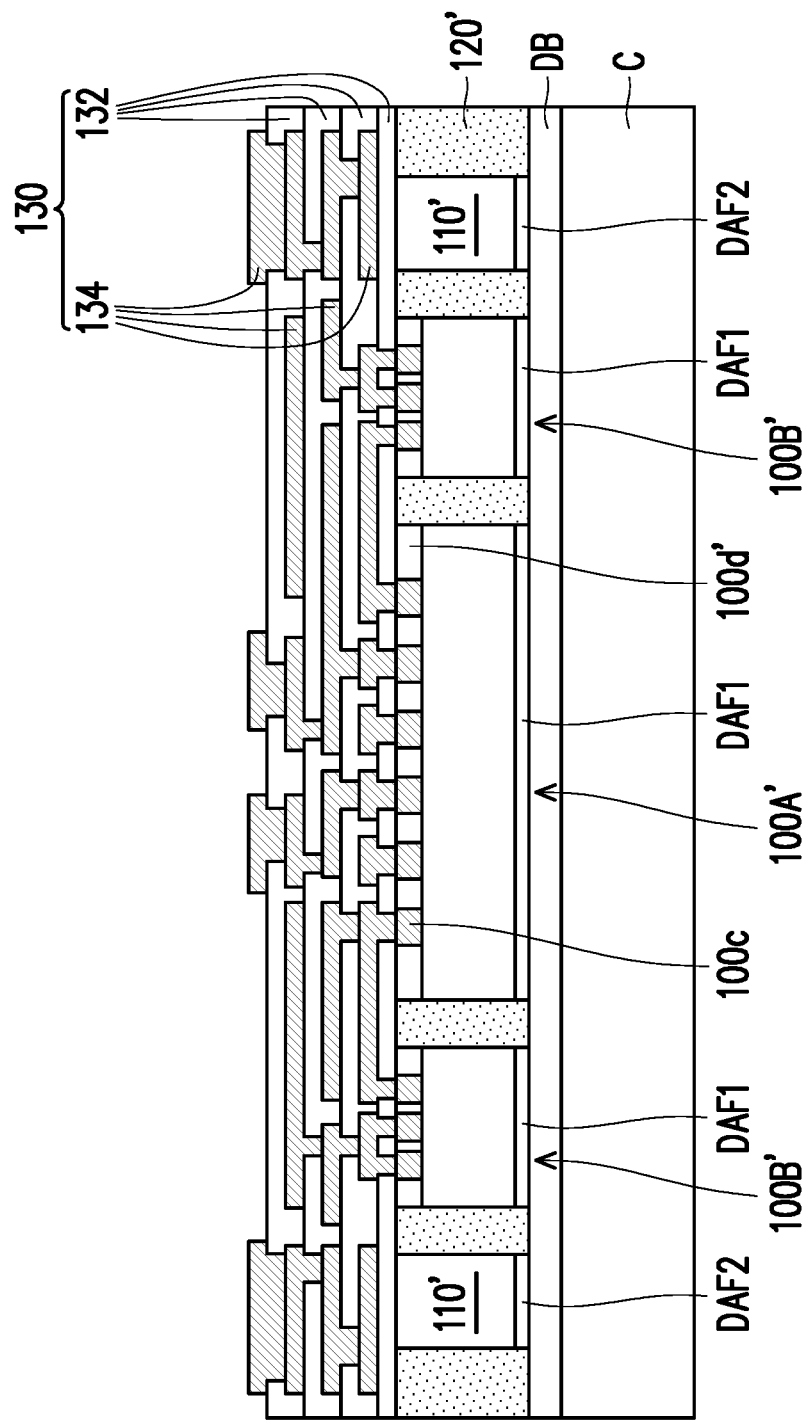

Referring to FIG. 6, after forming the insulating encapsulation 120', a redistribution circuit structure 130 is formed on the insulating encapsulation 120', the integrated circuit die 100A', the integrated circuit dies 100B' and the ring-shaped dummy die 110'. The redistribution circuit structure 130 is electrically connected to the conductive pillar 100c of the integrated circuit dies 100A and 100B. The redistribution circuit structure 130 provides fan-out function. The redistribution circuit structure 130 may include stacked dielectric layers 132 and redistribution wirings 134 embedded in the stacked dielectric layers 132, wherein the redistribution wirings 134 are electrically connected to the conductive pillar 100c of the integrated circuit dies 100A' and 100B', and the redistribution wirings 134 are electrically insulated from the ring-shaped dummy die 110'. The stacked dielectric layers 132 may be a polybenzoxazole (PBO) layer or other suitable polymer dielectric layers. The redistribution wirings 134 may include copper redistribution wirings or other suitable metallic redistribution wirings. At least parts of the redistribution wirings 134 extend laterally and provide fan-out or re-layout function. To provide the above-mentioned fan-out or re-layout function, contact vias may be formed in the stacked dielectric layers 132 and the redistribution wirings 134 may be electrically connected to the redistribution wirings 134 underneath through the contact vias formed in the stacked dielectric layers 132. The redistribution wirings 134 not only fill the contact vias and extend vertically in the contact vias, but also extend laterally or horizontally on the top surfaces of the stacked dielectric layers 132.

As illustrated in FIG. 6, the redistribution wirings 134 of the redistribution circuit structure 130 are spaced apart from the ring-shaped dummy die 110' by the bottommost dielectric layer among the stacked dielectric layers 132. In some embodiments, the ring-shaped dummy die 110' embedded in the insulating encapsulation 120' is electrically floating.

Figure 7:
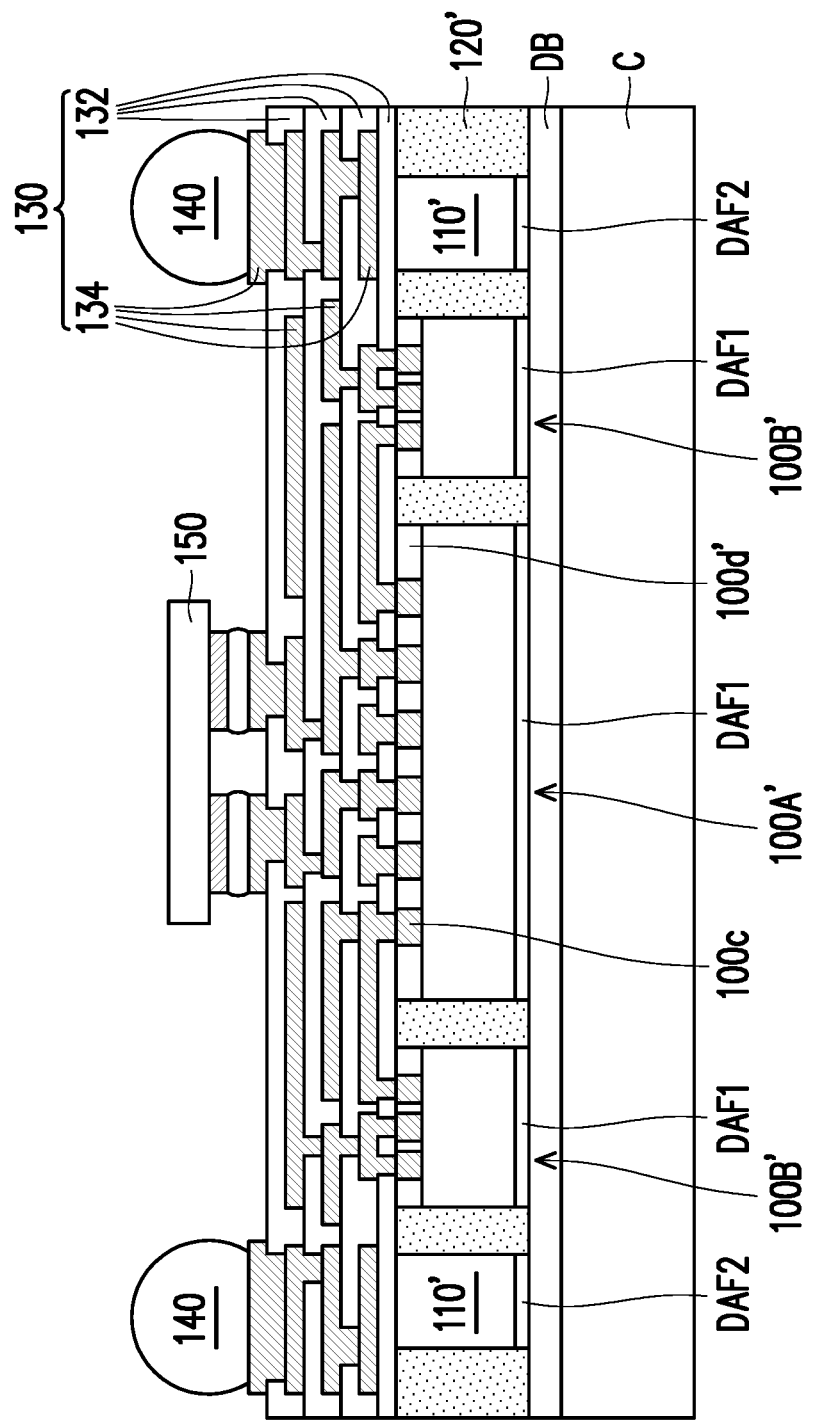

Referring to FIG. 7, after forming the redistribution circuit structure 130, conductive terminals 140 and/or at least one passive component 150 are placed on the redistribution circuit structure 130. The conductive terminals 140 and/or the at least one passive component 150 are electrically connected to the redistribution circuit structure 130. In some embodiments, the conductive terminals 140 may be solder balls which are placed on the redistribution circuit structure 130 by a ball placement process followed by a reflow process, and the at least one passive component 150 may be mounted on the redistribution circuit structure 130 through a pickup and place process followed by a reflow process. In some alternative embodiments, the conductive terminals 140 may include controlled collapse chip connection (i.e. C4) bumps or other suitable conductive bumps. The passive component 150 may include capacitor, inductor, resistor, and so on.

Figure 8:
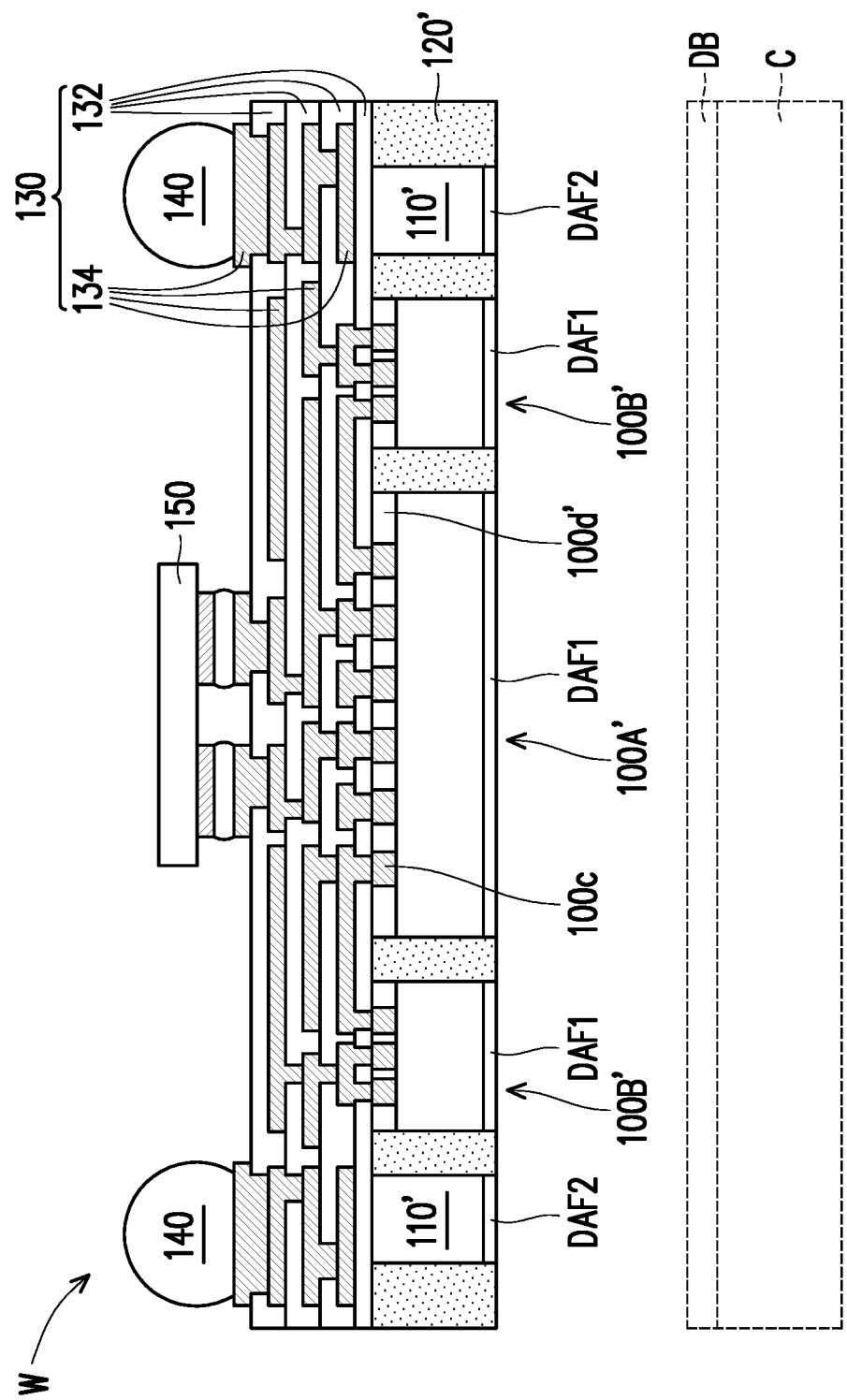

Referring to FIG. 8, after the conductive terminals 140 and/or the at least one passive component 150 are mounted on and electrically connected to the redistribution circuit structure 130, a de-bonding process is performed such that the de-bonding layer DB and the carrier C are de-bonded from the integrated circuit dies 100 and the insulating encapsulation 110. In some embodiments, the de-bonding layer DB (e.g., the LTHC release layer) may be irradiated by an UV laser such that the de-bonding process of the de-bonding layer DB and the carrier C is facilitated. In some alternative embodiments, the de-bonding layer DB may be heated by a thermal treatment (i.e. a thermal curing process) such that the de-bonding process of the de-bonding layer DB and the carrier C is facilitated.

As illustrated in FIG. 8, after performing the de-bonding process of the de-bonding layer DB and the carrier C, a bottom surface of the insulating encapsulation 120', bottom surfaces of the die attachment films DAF1, and a bottom surface of the die attachment film DAF2 are revealed. After performing the de-bonding process of the de-bonding layer DB and the carrier C, a re-constructed wafer W is formed and de-bonded from the carrier C.

Figure 9:
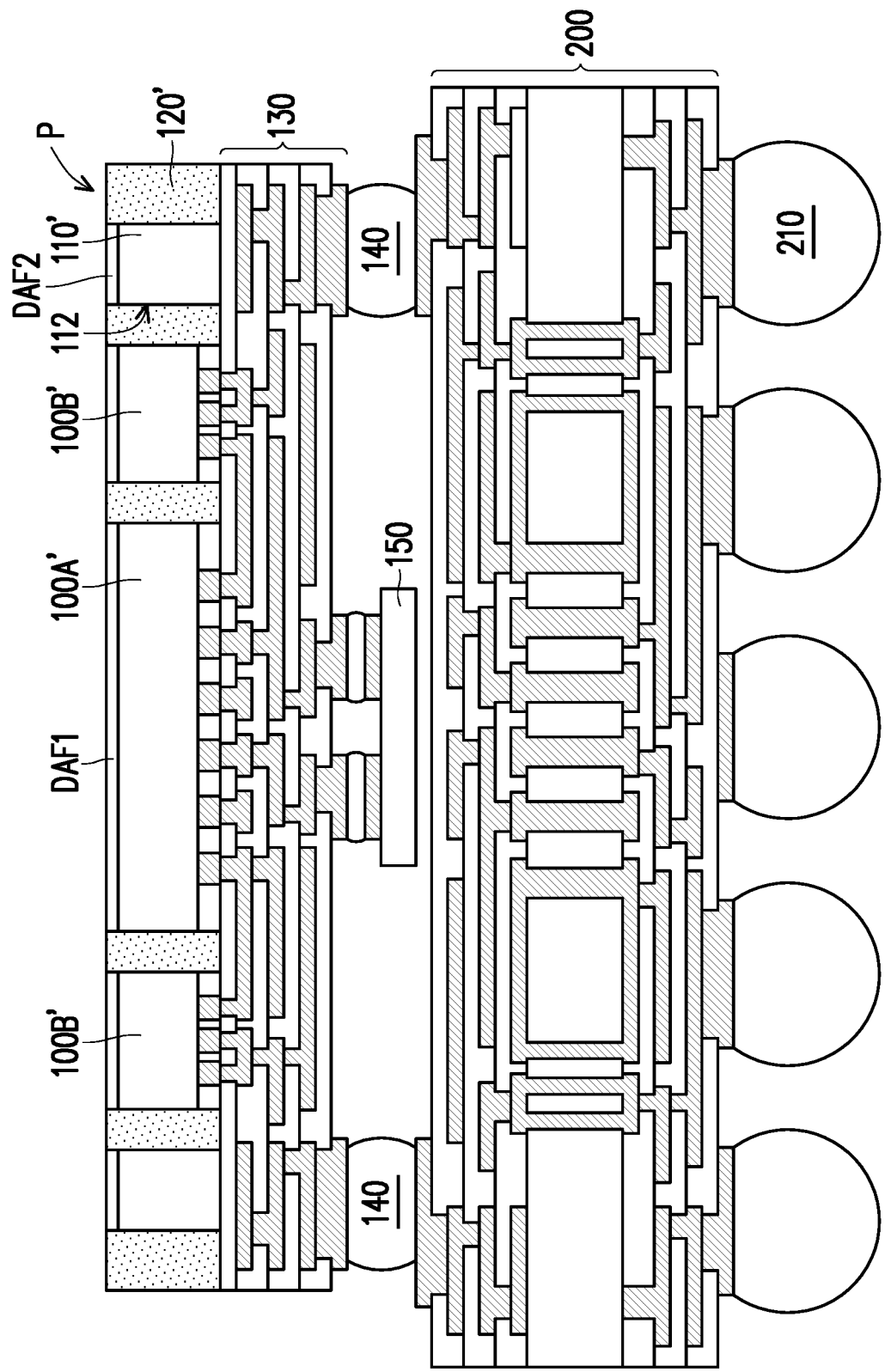
Figure 10A:
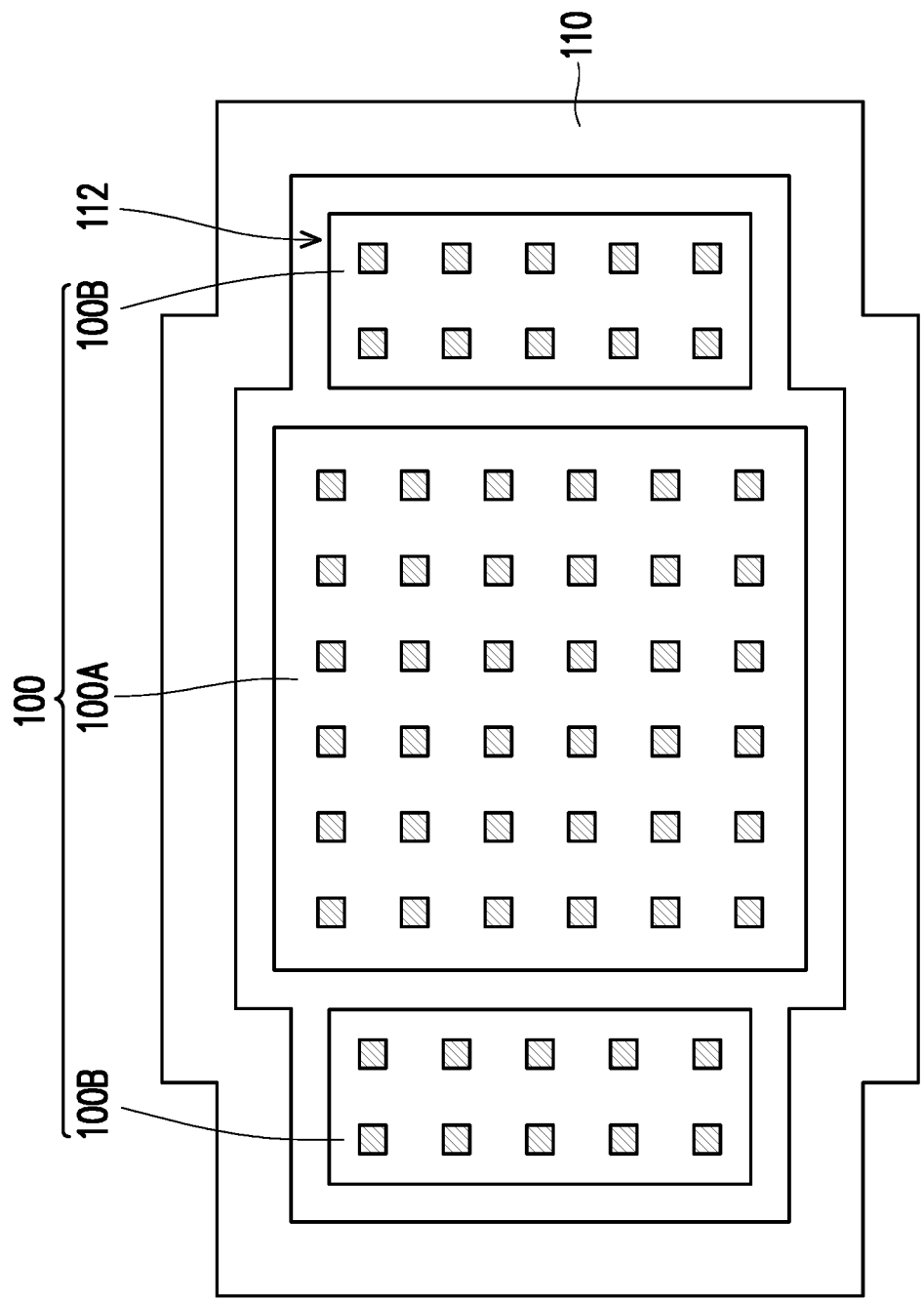
FIGS. 10A through 10C are top views schematically illustrating various arrangements of integrated circuit dies and a dummy die in accordance with the second embodiment of the present disclosure.
Figure 10B:
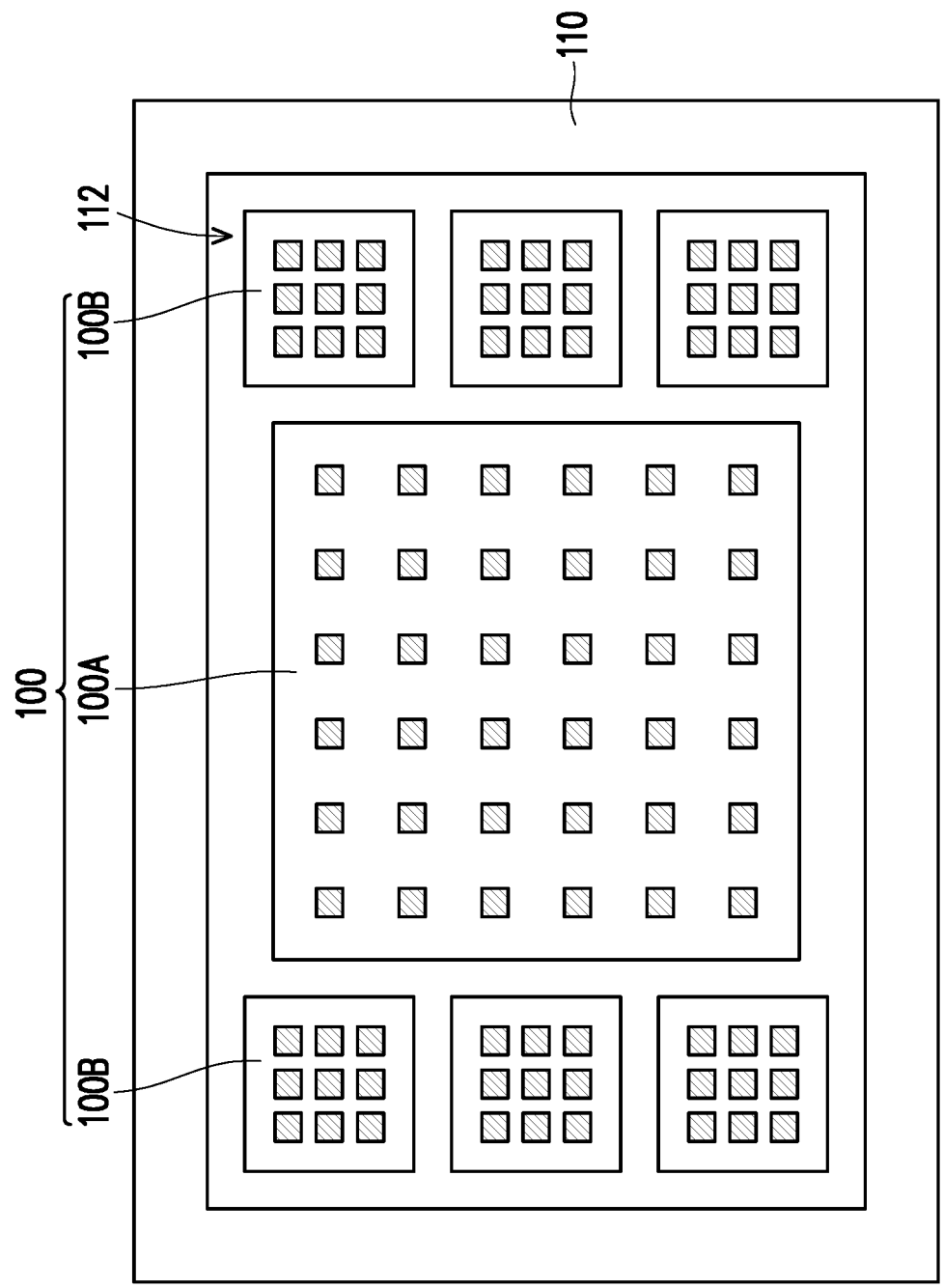
Figure 10C:
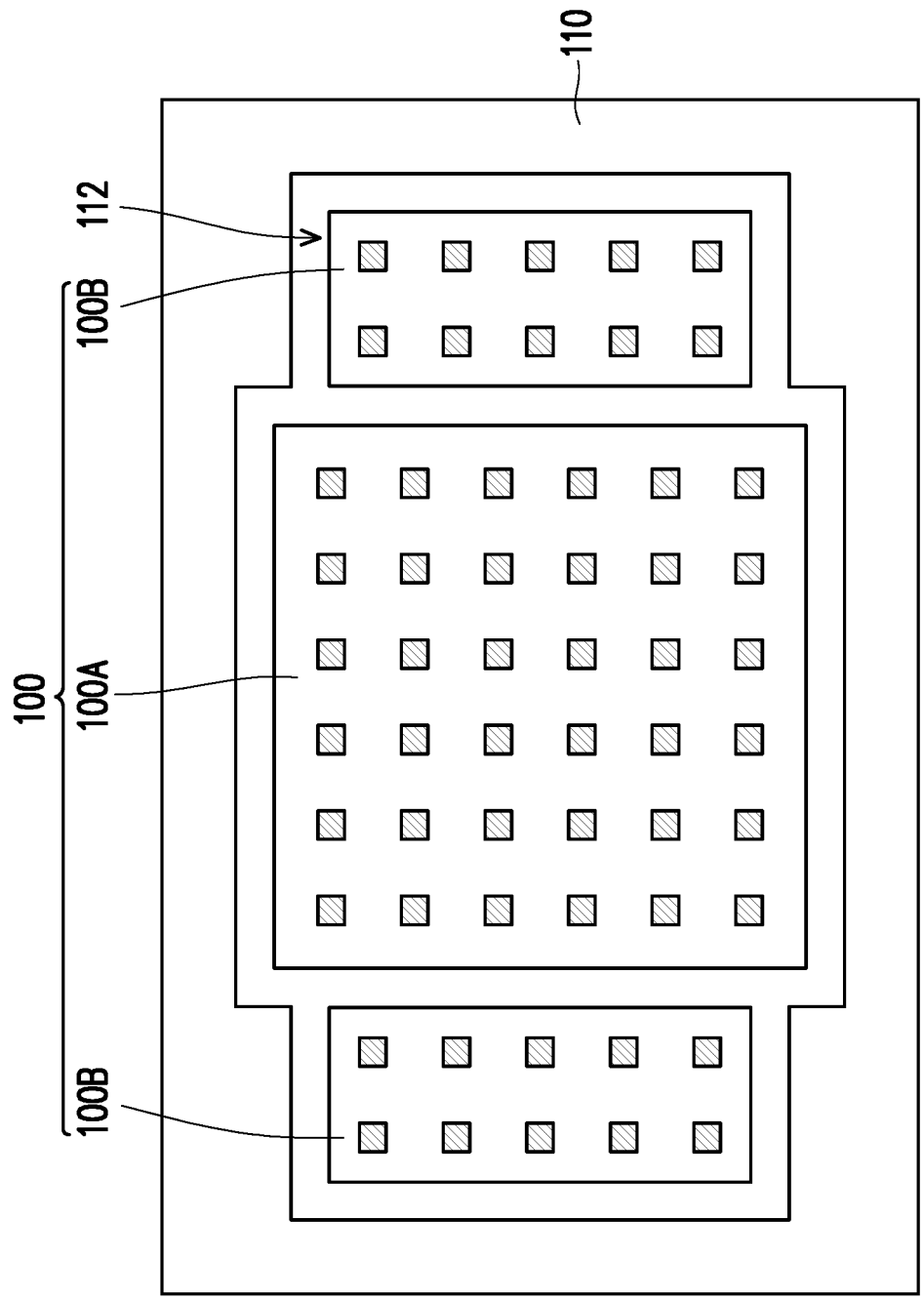

Referring to FIG. 8 and FIG. 9, a wafer saw process is performed scribe lines to singulated the re-constructed wafer W such that multiple singulated integrated fan-out packages P are obtained. As illustrated in FIG. 9, the singulated integrated fan-out package P is mounted on and electrically connected to a package substrate 200. The package substrate 200 may be a ball-grid array (BGA) substrate including solder balls 210 formed thereon. The singulated integrated fan-out package P may include integrated circuit dies 100A' and 100B', a single dummy die 110, an insulating encapsulation 120' and a redistribution circuit structure 130. The single dummy die 110' includes an aperture 112 for accommodating the integrated circuit dies 100A' and 100B', and the single dummy die 110' surrounds the integrated circuit dies 100A' and 100B'. The insulating encapsulation 120' laterally encapsulates the single dummy die 110' and the integrated circuit dies 100A' and 100B'. The redistribution circuit structure 130 is disposed on the single dummy die 110', the integrated circuit dies 100A' and 100B', and the insulating encapsulation 120', wherein the redistribution circuit structure 130 is electrically connected to the integrated circuit dies 100A' and 100B' by the insulating encapsulation 120', and the single dummy die 110' is electrically insulated from the redistribution circuit structure 130. In some embodiments, the single dummy die 110' is electrically floating. The package structure may further include die attachment films DAF1 and a die attachment film DAF2, wherein the die attachment films DAF1 cover bottom surfaces of the integrated circuit dies 100A' and 100B', and the die attachment film DAF2 covers the bottom surface of the single dummy die 110'. The die attachment films DAF1 and DAF2 are laterally encapsulated by the insulating encapsulation 120'. In some embodiments, bottom surfaces of the die attachment films DAF1 and DAF2 are substantially leveled with the bottom surface of the insulating encapsulation 120'. In some embodiments, the redistribution circuit structure 130 includes stacked dielectric layers 132 and redistribution wirings 134 embedded in the stacked dielectric layers 132, the single dummy die 110' is spaced apart from the redistribution wirings 134 by an outermost dielectric layer among the dielectric layers 132.

Figure 11:
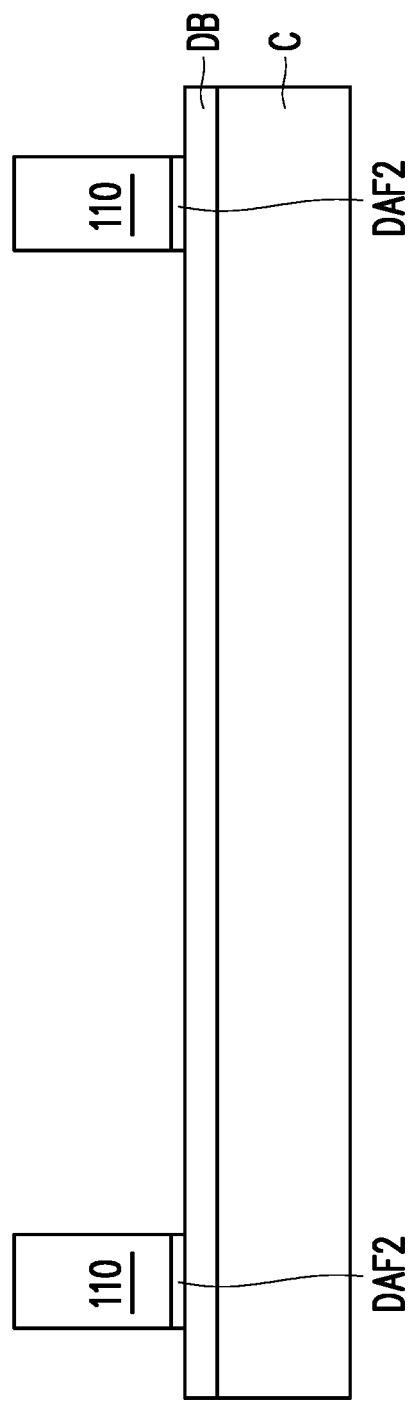
FIGS. 11 through 13 are cross-sectional views illustrating another process flow for fabricating an integrated fan-out package in accordance with some embodiments of the present disclosure.
Figure 12:
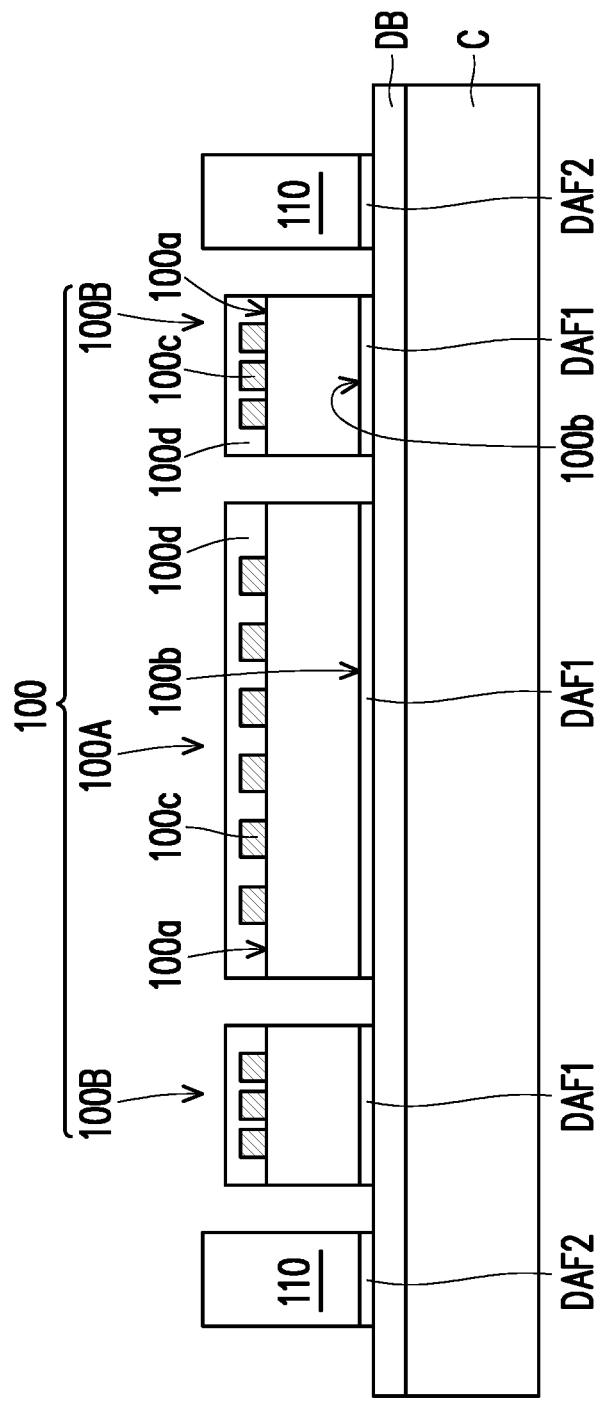
Figure 13:
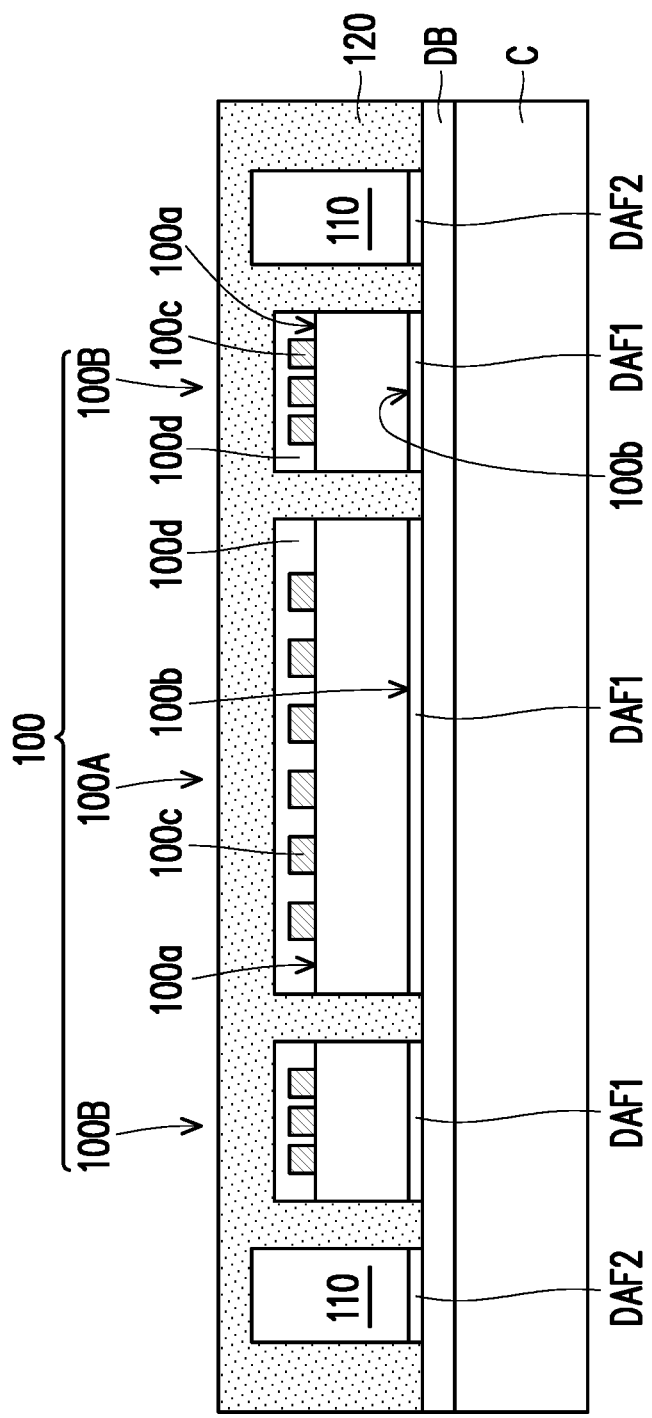

FIGS. 11 through 13 are cross-sectional views illustrating another process flow for fabricating an integrated fan-out package in accordance with some embodiments of the present disclosure. The process flow illustrated in FIGS. 11 through 13 is an alternative process flow of the process flow illustrated in FIGS. 2 through 4.

Referring to FIG. 11, a ring-shaped dummy die 110 including an aperture 112 is provided and mounted on a de-bonding layer DB carried by a carrier C through a die attachment film DAF2. A pick-up and place process may be performed to mount the ring-shaped dummy die 110 onto the de-bonding layer DB carried by the carrier C. The die attachment film DAF2 may be formed through a wafer level process. The ring-shaped dummy die 110 may be fabricated and cut from semiconductor substrates (e.g., semiconductor wafers). Before the cut process of the semiconductor substrates, die attachment material may be formed on surfaces of the semiconductor substrates, and a saw process may be then performed to cut the semiconductor substrates such that the ring-shaped dummy die 110 having the die attachment film DAF2 adhered thereon is obtained.

Referring to FIG. 12, after the ring-shaped dummy die 110 are mounted onto the de-bonding layer DB through the die attachment film DAF2, at least one group of integrated circuit dies 100 are mounted on the de-bonding layer DB carried by the carrier C. The group of integrated circuit dies 100 may be mounted on the de-bonding layer DB through a pick-up and place process. In some embodiments, as illustrated in FIG. 12, the integrated circuit dies 100 mounted on the de-bonding layer DB may be substantially identical in thickness. In some alternative embodiments, not illustrated in figures, the integrated circuit dies 100 mounted on the de-bonding layer DB may be different in thickness. Each one of the integrated circuit dies 100 may include an active surface 100a, a rear surface 100b opposite to the active surface 100a, and a plurality of conductive pillar 100c (e.g., aluminum pads) distributed on the active surface 100a. In some embodiments, the integrated circuit die 100 may further include a protection layer 100d, wherein the protection layer 100d is disposed on the active surface 100a and covers the conductive pillar 100c. The conductive pillar 100c are electrically connected to circuitry formed in the integrated circuit dies 100. The rear surfaces 100b of the integrated circuit dies 100 are adhered with the de-bonding layer DB carried by the carrier C. The rear surfaces 100b of the integrated circuit dies 100 may be adhered with the de-bonding layer DB through die attachment films DAF1. The material of the die attachment films DAF1 may be the same as or different from that of the die attachment film DAF2. The conductive pillars 100c disposed on the active surface 100a of the integrated circuit dies 100 may be formed by wafer level plating process. The protection layer 100d may be formed by wafer level deposition process. In some embodiments, the conductive pillars 100c are copper pillars. In some alternative embodiments, the conductive pillars 100c are copper pillars with solder caps (not shown) formed on the top surfaces thereof. The conductive pillars 100c may be made from other conductive materials, and the disclosure is not limited thereto. Furthermore, the material of the protection layer 100d may include silicon oxide, silicon nitride, polyimide, polybenzoxazole (PBO) or other suitable dielectric material.

The die attachment films DAF1 may be formed through a wafer level process. The integrated circuit dies 100 may be fabricated and singulated from semiconductor wafers. Before the singulation process of the semiconductor wafers, die attachment material may be formed on the rear surfaces of the semiconductor wafers, and a wafer saw process may be then performed to singulate the semiconductor wafers such that the integrated circuit dies 100 having the die attachment films DAF1 adhered on the rear surfaces thereof are obtained.

In FIG. 12, multiple integrated circuit dies 100 (e.g., three integrated circuit dies 100) are mounted on the de-bonding layer DB carried by the carrier C. It is noted that, the number of the integrated circuit dies 100 is merely for illustration, and the disclosure is not limited thereto. In some other embodiments, before the integrated circuit dies 100 and the single dummy die 110 are mounted onto the de-bonding layer DB, an insulating layer (not shown) is formed on the de-bonding layer DB in advance. The insulating layer is a polybenzoxazole (PBO) layer or other suitable polymer insulating layers, for example. In some alternative embodiments, before the integrated circuit dies 100 and the single dummy die 110 are mounted onto the de-bonding layer DB, a redistribution circuit structure including stacked dielectric layers and redistribution wirings embedded in the stacked dielectric layers is formed on the de-bonding layer DB in advance.

The group of integrated circuit dies 100 may include different types of integrated circuit dies 100A and 100B. As illustrated in FIG. 12, the group of integrated circuit dies 100 includes at least one System-on-Chip (SoC) die 100A (e.g., the semiconductor die 100A located at the central portion of FIG. 2) and at least two memory dies 100B (e.g., the semiconductor dies 100B located at the right and left portions of FIG. 2). The SoC die 100A among the group of integrated circuit dies 100 may include an application specific integrated circuit (ASIC) die, a radio frequency integrated circuit (RF-IC) die or combinations thereof. The memory dies 100B among the integrated circuit dies 100 may include memory chips, such as high bandwidth memory (HBM) chips, SRAM chips, DRAM chips, RRAM chips or combinations thereof. The functionality of the integrated circuit dies 100A and 100B is not limited in this disclosure.

As illustrated in FIG. 12 and FIGS. 10A through 10C, the ring-shaped dummy die 110 may be a semiconductor frame including the aperture 112. The ring-shaped dummy die 110 (i.e. the semiconductor frame) may be a silicon frame. The ring-shaped dummy die 110 surrounds the group of integrated circuit dies 100A and 100B, and the ring-shaped dummy die 110 is separated from the group of integrated circuit dies 100A and 100B. The shape of the aperture 112 of the ring-shaped dummy die 110 may be designed in accordance with profiles of the group of integrated circuit dies 100A and 100B.

In some embodiments, as illustrated in FIG. 10A, the group of integrated circuit dies 100 include one integrated circuit dies 100A and two integrated circuit dies 100B disposed at opposite sides of the integrated circuit dies 100A, and the ring-shaped dummy die 110 is a cross-shaped dummy die having a cross-shaped aperture 112. In some other embodiments, as illustrated in FIG. 10B, the group of integrated circuit dies 100 include one integrated circuit dies 100A and two rows of integrated circuit dies 100B (e.g., six integrated circuit dies 100B arranged in two rows) disposed at opposite sides of the integrated circuit dies 100A, and the ring-shaped dummy die 110 is a rectangular-shaped dummy die having a rectangular-shaped aperture 112. In some alternative embodiments, as illustrated in FIG. 10C, the group of integrated circuit dies 100 include one integrated circuit dies 100A and two integrated circuit dies 100B disposed at opposite sides of the integrated circuit dies 100A, and the ring-shaped dummy die 110 is a rectangular-shaped dummy die having a cross-shaped aperture 112.

In some embodiments, as illustrated in FIG. 12, the thickness of the integrated circuit dies 100A is substantially equal to that of the integrated circuit dies 100B, and the thickness of the group of integrated circuit dies 100A and 100B is greater than that of the ring-shaped dummy die 110. The thickness difference between the ring-shaped dummy die 110 and the group of integrated circuit dies 100A and 100B may be smaller than 150 micrometers. Since the thickness of the group of integrated circuit dies 100A and 100B is greater than the thickness of the ring-shaped dummy die 110, the ring-shaped dummy die 110 is not in contact with the pick-up head utilized in the pick-up and place process of the group of integrated circuit dies 100A and 100B. Accordingly, the ring-shaped dummy die 110 is not damaged by the pick-up head when mounting the group of integrated circuit dies 100A and 100B onto the de-bonding layer DB.

In some alternative embodiments, not illustrated in figures, the thickness of the integrated circuit dies 100A is different from that of the integrated circuit dies 100B, and the thickness of the group of integrated circuit dies 100A and 100B is greater than the thicknesses of the ring-shaped dummy die 110.

Referring to FIG. 13, after the integrated circuit dies 100A and 100B are mounted on the de-bonding layer DB, an insulating material 120 is formed over the de-bonding layer DB to entirely cover the group of integrated circuit dies 100A and 100B. In some embodiments, the insulating material 120 is formed through an over-mold process. The maximum thickness of the insulating material 120 is greater than the thickness of the ring-shaped dummy die 110 and the thickness of the group of integrated circuit dies 100A and 100B. The minimum thickness of the insulating material 120 may range from about 50 um to about 500 um. In some embodiments, the insulating material 120 includes resin and the filler added in the resin, wherein the resin is epoxy resin, the filler added in the resin may be silica or aluminum oxide ($Al_2O_3$), and the insulating material 120 may be formed by over-molding process. In some other embodiments, the insulating material 120 includes TEOS-formed oxide deposited by chemical vapor deposition (CVD) process.

In the above-mentioned integrated fan-out packages P, as illustrated in FIG. 9, the single ring-shaped dummy die 110' may control warpage of the integrated fan-out packages P and improve reliability of the integrated fan-out packages P. Furthermore, the single ring-shaped dummy die 110' in the integrated fan-out packages P may simplify fabrication process, save process time, and reduce fabrication costs because less pickup and placement times is needed.

In accordance with some embodiments of the present disclosure, a method of fabricating an integrated fan-out package is provided. A ring-shaped dummy die and a group of integrated circuit dies are mounted over a carrier, wherein the group of integrated circuit dies are surrounded by the ring-shaped dummy die. The ring-shaped dummy die and the group of integrated circuit dies over the carrier are encapsulated with an insulating encapsulation. A redistribution circuit structure is formed on the ring-shaped dummy die, the group of integrated circuit dies and the insulating encapsulation, wherein the redistribution circuit structure is electrically connected to the group of integrated circuit dies, and the ring-shaped dummy die is electrically floating. In some embodiments, a first pickup and place process is performed to mount the group of integrated circuit dies over the carrier, a second pickup and place process is performed to mount the ring-shaped dummy die over the carrier. In some embodiments, the first pickup and place process is performed prior to the second pickup and place process. In some embodiments, the first pickup and place process is performed after the second pickup and place process. In some embodiments, the ring-shaped dummy die and the group of integrated circuit dies are mounted over the carrier through die attachment films. In some embodiments, encapsulating the ring-shaped dummy die and the group of integrated circuit dies with the insulating encapsulation includes: forming an insulating material over the carrier to cover the ring-shaped dummy die and the group of integrated circuit dies; and thinning the insulating material to form the insulating encapsulation, wherein the ring-shaped dummy die and conductive terminals of the group of integrated circuit dies are revealed from a surface of the insulating encapsulation. In some embodiments, the ring-shaped dummy die is thicker than the group of integrated circuit dies before thinning the insulating material to form the insulating encapsulation, and the ring-shaped dummy die and the group of integrated circuit dies are substantially identical in thickness after thinning the insulating material to form the insulating encapsulation.

In accordance with alternative embodiments of the present disclosure, a method of fabricating an integrated fan-out package is provided. Integrated circuit dies are mounted over a carrier. A pickup and place process is performed to mount a semiconductor frame over the carrier, wherein the semiconductor frame includes an aperture for accommodating the integrated circuit dies, and the semiconductor frame is laterally separated from the integrated circuit dies. The semiconductor frame and the integrated circuit dies over the carrier are encapsulated with an insulating encapsulation. A redistribution circuit structure is formed on the semiconductor frame, the integrated circuit dies and the insulating encapsulation, wherein the redistribution circuit structure is electrically connected to the integrated circuit dies, and the semiconductor frame is electrically insulated from the redistribution circuit structure. In some embodiments, a first pickup and place process is performed to mount the integrated circuit dies over the carrier, a second pickup and place process is performed to mount the semiconductor frame over the carrier. In some embodiments, the first pickup and place process is performed prior to the second pickup and place process. In some embodiments, the first pickup and place process is performed after the second pickup and place process. In some embodiments, the semiconductor frame and the integrated circuit dies are mounted over the carrier through die attachment films. In some embodiments, encapsulating the semiconductor frame and the integrated circuit dies with the insulating encapsulation includes: forming an insulating material over the carrier to cover the semiconductor frame and the integrated circuit dies; and thinning the insulating material to form the insulating encapsulation, wherein the semiconductor frame and conductive terminals of the integrated circuit dies are revealed from a surface of the insulating encapsulation. In some embodiments, the semiconductor frame is thicker than the integrated circuit dies before thinning the insulating material to form the insulating encapsulation, and the semiconductor frame and the integrated circuit dies are substantially identical in thickness after thinning the insulating material to form the insulating encapsulation.

In accordance with yet alternative embodiments of the present disclosure, a package structure including integrated circuit dies, a single dummy die, an insulating encapsulation and a redistribution circuit structure is provided. The single dummy die includes an aperture for accommodating the integrated circuit dies, and the single dummy die surrounds the integrated circuit dies. The insulating encapsulation laterally encapsulates the single dummy die and the integrated circuit dies. The redistribution circuit structure is disposed on the single dummy die, the integrated circuit dies and the insulating encapsulation, wherein the redistribution circuit structure is electrically connected to the integrated circuit dies by the insulating encapsulation, and the single dummy die is electrically insulated from the redistribution circuit structure. In some embodiments, the integrated circuit dies include at least one logic die and memory dies arranged aside the at least one logic die. In some embodiments, the single dummy die is electrically floating. In some embodiments, the package structure further includes die attachment films, wherein the die attachment films cover surface of the integrated circuit dies and the single dummy die, and the die attachment films are laterally encapsulated by the insulating encapsulation. In some embodiments, surfaces of the die attachment films are substantially leveled with a surface of the insulating encapsulation. In some embodiments, the redistribution circuit structure includes stacked dielectric layers and redistribution wirings embedded in the stacked dielectric layers, the single dummy die is spaced apart from the redistribution wirings by an outermost dielectric layer among the dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a ring-shaped dummy die and integrated circuit dies, the ring-shaped dummy die comprising a first die attachment film attached thereon, and each of the integrated circuit dies respectively comprising a second die attachment film laterally spaced apart from the first die attachment film;
mounting the ring-shaped dummy die over a carrier through the first die attachment film;
mounting each of the integrated circuit dies over the carrier through the second die attachment film, wherein the integrated circuit dies are surrounded by the ring-shaped dummy die;
forming an insulating material over the carrier to cover the ring-shaped dummy die, the first die attachment film, the second die attachment film and the integrated circuit dies;
thinning the insulating material to form an insulating encapsulation, wherein the ring-shaped dummy die and conductive terminals of the integrated circuit dies are revealed from a surface of the insulating encapsulation; and
forming a redistribution circuit structure on the ring-shaped dummy die, the integrated circuit dies and the insulating encapsulation, the redistribution circuit structure being electrically connected to the integrated circuit dies, and the ring-shaped dummy die being electrically floating.

2. The method of claim 1, wherein a first pickup and place process is performed to mount the integrated circuit dies over the carrier, and a second pickup and place process is performed to mount the ring-shaped dummy die over the carrier.

3. The method of claim 2, wherein the first pickup and place process is performed prior to the second pickup and place process.

4. The method of claim 2, wherein the first pickup and place process is performed after the second pickup and place process.

5. The method of claim 1, wherein the ring-shaped dummy die and the integrated circuit dies are mounted on a surface of the carrier, the insulating encapsulation is in contact with the surface of the carrier, the first die attachment film and the second die attachment film.

6. The method of claim 1, wherein
before thinning the insulating material to form the insulating encapsulation, the ring-shaped dummy die is thicker than the integrated circuit dies.

7. The method of claim 1, wherein
after thinning the insulating material to form the insulating encapsulation, the ring-shaped dummy die and the integrated circuit dies are substantially identical in thickness.

8. A method, comprising:
mounting integrated circuit dies over a carrier;
performing a pickup and place process to mount a semiconductor frame over the carrier, the semiconductor frame comprising an aperture for accommodating the integrated circuit dies, and the semiconductor frame being laterally separated from the integrated circuit dies, wherein the semiconductor frame is mounted over the carrier through a first die attachment film, and the integrated circuit dies are mounted over the carrier through second die attachment film spaced apart from the first die attachment film;

forming an insulating material over the carrier to cover the semiconductor frame, the first die attachment film, the second die attachment films and the integrated circuit dies;

thinning the insulating material to form an insulating encapsulation, wherein the semiconductor frame and conductive terminals of the integrated circuit dies are revealed from a surface of the insulating encapsulation; and forming a redistribution circuit structure on the semiconductor frame, the integrated circuit dies and the insulating encapsulation, the redistribution circuit structure being electrically connected to the integrated circuit dies, and the semiconductor frame being electrically insulated from the redistribution circuit structure.

9. The method of claim 8, wherein a first pickup and place process is performed to mount the integrated circuit dies over the carrier, and a second pickup and place process is performed to mount the semiconductor frame over the carrier.

10. The method of claim 9, wherein the first pickup and place process is performed prior to the second pickup and place process.

11. The method of claim 9, wherein the first pickup and place process is performed after the second pickup and place process.

12. The method of claim 8, wherein semiconductor frame and the integrated circuit dies are mounted on a surface of the carrier, the insulating encapsulation is in contact with the surface of the carrier, the first die attachment film and the second die attachment films.

13. The method of claim 8, wherein
before thinning the insulating material to form the insulating encapsulation, the semiconductor frame is thicker than the integrated circuit dies.

14. The method of claim 8, wherein
after thinning the insulating material to form the insulating encapsulation, the semiconductor frame and the integrated circuit dies are substantially identical in thickness.

15. A package structure, comprising:
integrated circuit dies;
a single dummy die comprising an aperture for accommodating the integrated circuit dies, the single dummy die surrounding the integrated circuit dies;
a first die attachment film disposed on a surface of the single dummy die;
second die attachment films disposed on a surface of the integrated circuit dies;
an insulating encapsulation laterally encapsulating the first die attachment film, the second die attachment films, the single dummy die and the integrated circuit dies;
a redistribution circuit structure disposed on the single dummy die, the integrated circuit dies and the insulating encapsulation, the redistribution circuit structure being electrically connected to the integrated circuit dies by the insulating encapsulation, and the single dummy die being electrically insulated from the redistribution circuit structure, wherein the redistribution circuit structure comprises stacked dielectric layers and redistribution wirings embedded in the stacked dielectric layers, the single dummy die is spaced apart from the redistribution wirings by an outermost dielectric layer among the dielectric layers.

16. The package structure of claim 15, wherein the integrated circuit dies comprise at least one logic die and memory dies arranged aside the at least one logic die.

17. The package structure of claim 15, wherein the single dummy die is electrically floating.

18. The package structure of claim 15, wherein sidewalls of the first die attachment film and sidewalls of the second die attachment films are in contact with the insulating encapsulation.

19. The package structure of claim 18, wherein surfaces of the first die attachment film and the second die attachment films are substantially leveled with a surface of the insulating encapsulation.

20. The package structure of claim 15, wherein the single dummy die comprises a ring-shaped dummy die.

* * * * *